United States Patent [19]

Herberg

[11] Patent Number: 4,495,026
[45] Date of Patent: Jan. 22, 1985

[54] METHOD FOR MANUFACTURING METALLIZED SEMICONDUCTOR COMPONENTS

[75] Inventor: Helmut Herberg, Munich, Fed. Rep. of Germany

[73] Assignee: Siemens Aktiengesellschaft, Berlin & Munich, Fed. Rep. of Germany

[21] Appl. No.: 523,574

[22] Filed: Aug. 16, 1983

[30] Foreign Application Priority Data

Sep. 3, 1982 [DE] Fed. Rep. of Germany ....... 3232837

[51] Int. Cl.³ .......................... C23F 1/02; B44C 1/22; C03C 15/00; C03C 25/06
[52] U.S. Cl. .................................. 156/652; 156/656; 156/659.1; 427/102; 427/103; 430/318
[58] Field of Search ............ 156/650, 652, 656, 659.1, 156/661.1, 665; 252/79.2; 430/312, 313, 318; 427/101–103

[56] References Cited

U.S. PATENT DOCUMENTS 3,686,080  8/1972  Banfield et al. ................. 156/652 X
3,883,947  5/1975  Kruger et al. ................... 156/656 X

FOREIGN PATENT DOCUMENTS 2431506  1/1976  Fed. Rep. of Germany .

OTHER PUBLICATIONS

IBM Technical Disclosure Bulletin, vol. 20, No. 8, Jan. 1978, Chrome-Copper-Chrome Lift-Off Process, H. Dalal et al., pp. 3080–3081.

*Primary Examiner*—William A. Powell
*Attorney, Agent, or Firm*—Hill, Van Santen, Steadman & Simpson

[57] ABSTRACT

A method for the manufacture of metallized semiconductor components, particularly power semiconductor components such as thyristors in which the semiconductor substrate is covered with at least three metal layers including a base layer attached to the substrate, an intermediate layer, and an upper layer upon which the various photoresist compositions are located to define the electrode structures, the intermediate layer being composed of a metal which has different solubility characteristics than either the upper or lower metal layers so that the various layers can be selectively etched by means of suitable solvents.

6 Claims, 7 Drawing Figures

METHOD FOR MANUFACTURING METALLIZED SEMICONDUCTOR COMPONENTS

BACKGROUND OF THE INVENTION

1. Field of the Invention

The present invention is in the field of metallization of semiconductor components particularly thyristors whose conductive patterns are provided by selective use of photoresist compositions and in which a multi-plane series of layers is provided permitting selective etching through the layers depending on the choice of solvent.

2. Description of the Prior Art

Because of high current load, power semiconductor components must be provided with relatively large connector structures. For this purpose, particularly in the case of disconnectable thyristors or in the case of finger type structures, the metal layer constituting the emitter circuit must have a greater thickness, for example, 20 μm, than the thickness of the base metal layer which is typically about 5 μm.

It has previously been proposed to manufacture a two-level-metallic structure wherein a groove or channel is etched and a simple metallizing procedure is conducted, or by employing round sections of molybdenum or silver on the electrode surfaces. Other possibilities include the use of two etching processes in sequence, or reinforcing one of the two contacts. These methods are relatively costly and imprecise.

A method for the manufacture of an auxiliary emitter electrode, and emitter electrodes of a thyristor, is disclosed in German Letters Patent No. 24 31 506 (U.S. Pat. No. 4,096,623). The disclosure of said U.S. Patent is incorporated herein by reference. In this known method, the semiconductor base member of the thyristor is covered with a metal layer having a thickness appropriate for the emitter electrodes. By means of a first photomasking operation, a first pattern consisting of a first photosensitive resist is applied in a configuration of the emitter electrode and the control electrode. By means of a second photomasking, a second pattern corresponding to the configuration of the auxiliary emitter electrode is applied, consisting of another photosensitive resist whose solvent does not dissolve the first photosensitive resist. Subsequently, through a first etching, the unmasked regions of the metal layer are etched away, the second pattern is separated and the auxiliary emitter electrode is brought by means of a second etching to the desired thickness. The metallization layer consists of aluminum, the first resist layer consists of a negative reacting resist composition, and the second resist layer utilizes a positive acting resist layer.

The method described in this aforementioned patent, which operates with two different photoresists, possesses the great advantage of employing a photoresist structure only on planar layers, that is, edge covering problems do not occur in the case of 20 μm high metal layers. However, difficulties arise due to the fact that a uniform etching of a 5 to 15 μm-thickness of aluminum layer is not readily attainable over a larger area such as a diameter of 50 to 100 mm.

SUMMARY OF THE INVENTION

The present invention consists in eliminating those difficulties and provides a method which results in a uniform layer thickness in a two-plane metallization process. In particular, in the manufacture of pressure contacted thyristors in which the emitter metal has a greater thickness than the base, the base metal must exhibit a reproducible thickness over the entire substrate disk.

In the case of the present invention, this objective is achieved by means of a metallization technique wherein a combination of metals is deposited, the combination consisting of at least three layers. The uppermost and lowermost layers may consist of the same metal, but the intermediate layer exhibits different solubility characteristics than either the uppermost or lowermost layer. In the preferred embodiment of the invention, the uppermost and lowest layers consist of the same metal and the three layers are respectively aluminum, silver and aluminum. In the particularly preferred form of the invention, the thickness of the aluminum-silver-aluminum layers is about 2:1:2.

As applied to the manufacture of a pressure-contacted thyristor wherein the emitter metal layer is thicker than the base metal layer, the improved method of the present invention includes the following steps in sequence:

(a) successively applying layers of aluminum, silver and aluminum on the thyristor substrate;

(b) applying a negative acting photoresist in selected areas of the emitter region in the usual manner to thereby form a predetermined conductivity pattern in the emitter region;

(c) applying a positive acting photoresist in selected areas of the base region which, upon the use of conventional photolithographing produces a predetermined conductivity pattern in the base region;

(d) etching away areas of the uppermost aluminum layer at locations of the substrate which are not covered by either type of photoresist, utilizing a solvent which does not significantly attack the silver layer;

(e) etching away the intermediate silver layer which is not covered by either type of photoresist, utilizing a solvent which does not significantly attack the aluminum layers;

(f) removing the positive acting photoresist;

(g) etching away the lowermost aluminum layer at locations of the substrate which are not covered by negative photoresist deposits with a solvent which does not significantly attack silver or the substrate, and (h) removing the remaining negative photoresist deposits.

Additional benefits are derived if the metal layers are finally heat treated in an inert atmosphere at 400° to 500° C.

The preferred solvents and steps (d) and (g) are dilute hydrochloric acid or hot phosphoric acid. The preferred solvent used in step (e) to attack the silver is nitric acid.

BRIEF DESCRIPTION OF THE DRAWINGS

The attached sheet of drawings, in FIGS. 1 to 7, illustrates the sequence of steps employed in producing the improved semiconductor devices of the present invention on a highly enlarged scale.

DESCRIPTION OF THE PREFERRED EMBODIMENTS

Figure 1:
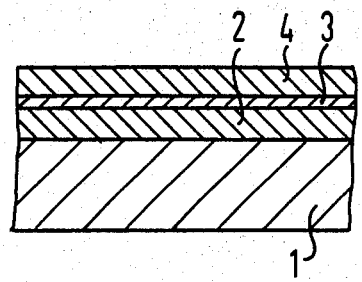

The Figures of the drawings show in cross section the manufacture of a two-plane metallization structure. Reference numeral 1 in FIG. 1 has been applied to a thyristor substrate structure usually composed of silicon, and is not discussed in greater detail. On the substrate 1, there is first provided an aluminum layer 2 as by vapor deposition to a layer thickness of, for example, 8 μm. Then, a silver layer 3 having a thickness of about 4 μm is applied over the lower aluminum layer and finally an upper layer of aluminum measuring about 8 μm thickness is applied.

Figure 2:
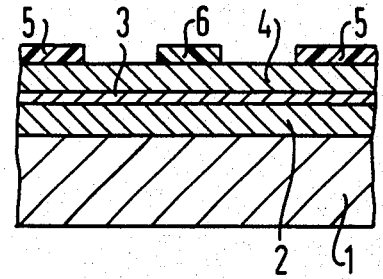

As shown in FIG. 2, the first step consists of applying a layer 5 of negative acting photoresist and defining the structure in the layer 5 and, on the same plane, a layer 6 consisting of a positive acting photoresist and defining the structure in the layer 6. The negative acting photoresist 5 is applied in selected areas of the emitter region while the positive acting photoresist 6 is applied over the base region.

Figure 3:
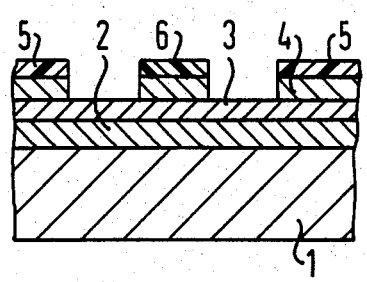

As illustrated in FIG. 3 the next step consists in treating with an etching agent which does not attack the silver layer 3 but which dissolves the aluminum layer 4 in those areas not covered by either type of photoresist structure 5 or 6. Dilute hydrochloric acid or hot phosphoric acid can be used as the etching agent since neither significantly affect the solubility of the underlying silver layer 3.

Figure 4:
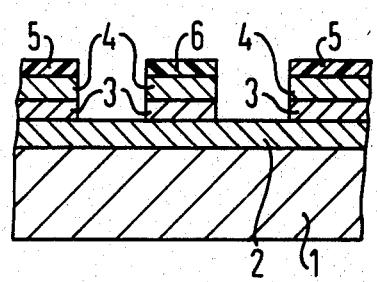
Figure 5:
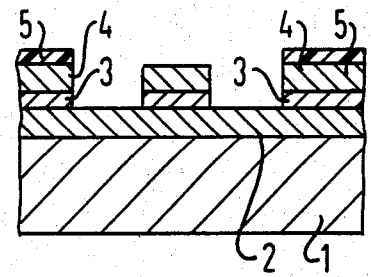

Subsequently, the silver layer 3 which is not covered by the photoresist structures 5 and 6 is removed with an etching agent which does not dissolve aluminum. For this purpose, nitric acid can be used resulting in the structure shown in FIG. 4. After removal of the positive resist structure 6 with a suitable solvent, the structure of FIG. 5 results.

Figure 6:
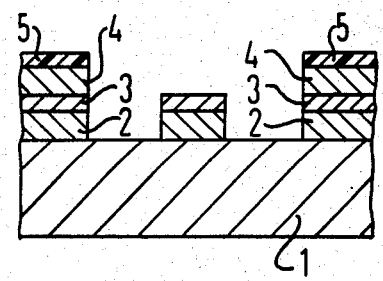
Figure 7:
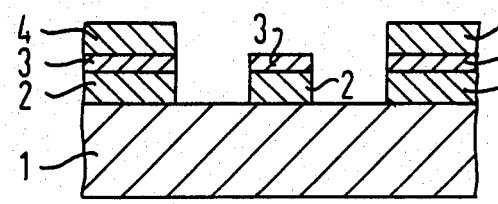

The next step consists in a second hydrochloric acid or phosphoric acid etch, resulting in the removal of those portions of aluminum layer 2 not covered by the negative resist structure 5 as can be seen from FIG. 6. Subsequently, as seen from FIG. 7, the negative resist structure 5 is removed leaving the clearly defined areas of emitter region and base region.

Further improvements are provided if the layers of metal are heat treated in an inert atmosphere at 400° to 500° C.

The method described herein is also applicable to other semiconductor components, for example, any which require that there be a clear-cut demarcation between the emitter and base terminals. The method of the invention is also particularly applicable to the manufacture of gate turn off thyristors (GTO).

It should be evident that various modifications can be made to the described embodiments without departing from the scope of the present invention.

I claim as my invention:

1. A method for the manufacture of a pressure-contacted thyristor wherein the emitter metal layer is thicker than the base metal layer, comprising the following steps in sequence:
   (a) successively applying layers of aluminum, silver and aluminum on the thyristor substrate,
   (b) applying a negative acting photoresist in selected areas of the emitter region to thereby form a predetermined conductivity pattern in said emitter region,
   (c) applying a positive acting photoresist in selected areas of the base region to thereby form a predetermined conductivity pattern in said base region,
   (d) etching away areas of the uppermost aluminum layer at locations of the substrate which are not covered by either type of photoresist utilizing a solvent which does not significantly attack said silver layer,
   (e) etching away the intermediate silver layer which is not covered by either type of photoresist, utilizing a solvent which does not significantly attack said aluminum layers,
   (f) removing the positive acting photoresist,
   (g) etching away the lowermost aluminum layer at locations on said substrate which are not covered by negative photoresist deposits with a solvent which does not significantly attack silver or said substrate, and
   (h) removing the remaining negative photoresist deposits.

2. A method according to claim 1 which includes the additional step of:
   heat treating the metal layers in an inert atmosphere of 400° to 500° C.

3. A method according to claim 1 in which the solvent in steps (d) and (g) is dilute hydrochloric acid.

4. A method according to claim 1 in which the solvent in steps (d) and (g) is hot phosphoric acid.

5. A method according to claim 1 in which the solvent used in step (e) is nitric acid.

6. A method according to claim 1 in which:
   the two aluminum layers are each about 8 μm thick and the intermediate silver layer is about 4 μm thick.

* * * * *